US008840795B2

(12) United States Patent
Jeong et al.

(10) Patent No.: US 8,840,795 B2
(45) Date of Patent: Sep. 23, 2014

(54) METHOD FOR MANUFACTURING A MASTER MOLD WHICH IS USED TO FORM A MICROPATTERNED FILM APPLIED TO AN EXTERIOR OF A HOUSEHOLD APPLIANCE AND MANUFACTURING APPARATUS AND METHOD OF THE FILM USING THE MASTER MOLD

(75) Inventors: Seok Jae Jeong, Changwon-si (KR);
Young Kyu Kim, Changwon-si (KR); Ju Hyun Kim, Changwon-si (KR)

(73) Assignee: LG Electronics Inc., Seoul (KR)

(*) Notice: Subject to any disclaimer, the term of this patent is extended or adjusted under 35 U.S.C. 154(b) by 168 days.

(21) Appl. No.: 13/392,174

(22) PCT Filed: Sep. 3, 2010

(86) PCT No.: PCT/KR2010/006000
§ 371 (c)(1),
(2), (4) Date: Feb. 24, 2012

(87) PCT Pub. No.: WO2011/028060
PCT Pub. Date: Mar. 10, 2011

(65) Prior Publication Data
US 2012/0152888 A1    Jun. 21, 2012

(30) Foreign Application Priority Data

Sep. 3, 2009  (KR) .................. 10-2009-0083054
Sep. 3, 2009  (KR) .................. 10-2009-0083055

(51) Int. Cl.
*B44C 1/22*      (2006.01)
*B29C 33/38*     (2006.01)
*G03F 7/00*      (2006.01)
*B29C 33/42*     (2006.01)

(52) U.S. Cl.
CPC .......... *B29C 33/3878* (2013.01); *G03F 7/0017* (2013.01); *G03F 7/0002* (2013.01); *B29C 33/424* (2013.01)
USPC ................. 216/11; 216/41; 216/83; 430/325; 264/293; 264/319

(58) Field of Classification Search
USPC .................. 216/11, 41, 83; 430/325; 264/319
See application file for complete search history.

(56) References Cited

U.S. PATENT DOCUMENTS 7,682,545 B2 * 3/2010 Katsoulis et al. ............. 264/293
2004/0047938 A1 3/2004 Kosuga et al.
(Continued)

FOREIGN PATENT DOCUMENTS

CN         1542550 A      11/2004
EP         1 477 849      11/2004
(Continued)

OTHER PUBLICATIONS

International Search Report issued in PCT Application No. PCT/KR2010/006000 dated Mar. 30, 2011.
Chinese Office Action dated Dec. 31, 2013 issued in Application No. 201080039300.0.

*Primary Examiner* — Shamim Ahmed
(74) *Attorney, Agent, or Firm* — Ked & Associates, LLP

(57) ABSTRACT

An apparatus and a method of manufacturing a micropatterned film are disclosed. More particularly, a method for manufacturing a master mold capable of forming a micropattern on a film applied to an exterior of a household appliance, an apparatus and a method for production of a micropatterned film using the above master mold, and appliances having such micropatterned films attached thereto are disclosed. The method for manufacturing a master mold used for forming a micropatterned film applied to an exterior of a household appliance includes, applying photoresist (110) to a surface of an STS substrate (100) and UV irradating the same through a patterned mask (140) to transfer the pattern of the mask (140) to the substrate (100), etching the STS substrate (100) to which the pattern has been transferred removing the photoresist (110) from the etched STS substrate (100), and reproducing the pattern of the STS substrate on a synthetic resin substrate (210).

8 Claims, 7 Drawing Sheets

(56) References Cited

U.S. PATENT DOCUMENTS

| | | |
|---|---|---|
| 2004/0119197 A1 | 6/2004 | Dasgupta et al. |
| 2004/0175843 A1* | 9/2004 | Roitman et al. ............. 436/531 |
| 2006/0225463 A1* | 10/2006 | Sugimoto et al. ................. 65/31 |
| 2008/0063817 A1* | 3/2008 | Tanaka et al. ................ 428/32.5 |
| 2009/0131887 A1* | 5/2009 | Shiomitsu et al. ............ 604/272 |
| 2009/0140284 A1* | 6/2009 | Kurino et al. ................ 257/100 |
| 2010/0239783 A1* | 9/2010 | Mao et al. ..................... 427/578 |

FOREIGN PATENT DOCUMENTS

| | | |
|---|---|---|
| EP | 2 037 453 | 3/2009 |
| JP | 03-150738 | 6/1991 |
| JP | 2007-144995 | 6/2007 |
| JP | 2009-087431 | 4/2009 |

* cited by examiner (a)

(b)

(c)

(d)

METHOD FOR MANUFACTURING A MASTER MOLD WHICH IS USED TO FORM A MICROPATTERNED FILM APPLIED TO AN EXTERIOR OF A HOUSEHOLD APPLIANCE AND MANUFACTURING APPARATUS AND METHOD OF THE FILM USING THE MASTER MOLD

TECHNICAL FIELD

The present invention relates to a manufacturing method and apparatus of micropatterned films, and more particularly, to a method of manufacturing a master mold for forming a micropatterned film applied to an exterior of a household appliance, and an apparatus and a method for production of a micropatterned film using the foregoing master mold.

BACKGROUND ART

Injection molding is a process for fabrication of an article having the same shape as a molding cavity by feeding molten resin into the molding cavity in a certain form to fill the same and chilling the charged resin. According to recent advances in MEMS technology, a variety of different structures are now being fabricated using a stamp having a micropattern formed thereon.

In particular, such injection molding is generally used for mass-production of plastic articles and, since demand for plastic articles composed of high-strength polymers with excellent durability is noticeably increased with technical development over time, injection molding techniques are also currently utilized in a variety of applications.

In recent years, injection molding has been applied to production of plastic products used in aerospace, precision and/or optical instrument applications as well as general household plastic articles and, especially, may be used for some products requiring fine and precise patterns.

Briefly, in order to manufacture a plastic structure having a micropattern with a size of several nanometers to several micrometers formed on a surface of the structure, injection molding may be employed.

However, as to fabrication of a plastic article having a micropattern with a size of several nanometers to micrometers, an alternative stamper corresponding to the micropattern is duly used and such stamper is generally a plate type stamper.

Using the micropatterned stamper, shaped articles capable of embodying optical effects owing to constructive or destructive interference of light may be fabricated. For example, a micropattern have a nanometer scale line width is used, in turn being applicable to a high resolution spectrometer. Alternatively, a light diffusion promoting pattern may be formed, in turn being used as a backlight unit for an LCD.

Furthermore, by providing photonic band gap effects through regular alignment of ultra-fine patterns, light with a specific wavelength only may be reflected at the ultra-fine patterns while other wavelengths of light are transmitted and absorbed.

In general, in order to fabricate a stamper having such a micropattern or an ultra-fine pattern, a LIGA process (Lithographie, Galvanoformung, Abformung in German) is employed. FIG. 1 schematically illustrates a stamper fabrication process according to conventional technologies. Such a process includes: washing a silicon or glass substrate 10 and, after applying photoresist 20 to a surface of the substrate 10, soft baking the coating photoresist 20; placing a pattern mask with a desired pattern over the baked photoresist, exposing the same to light, developing the substrate through the exposed photoresist 20a, hard baking a part of the substrate on which the photoresist is partially removed from the substrate, in order to form the desired pattern; vacuum depositing any one of CrON, DLC (Diamond like carbon), C4F8, SAM (Self-assembled monolayer), etc. in order to form a seed layer 30; plating a metal such as Ni or Cu over the seed layer 30 to form a plated layer 50; and separating the plated layer 50 to form a stamper 50. Additional processes such as planarization of the stamper 50 and cutting of the planarized stamper may be further included, thereby manufacturing a master stamper.

However, in view of manufacturing time and cost, the foregoing method for fabrication of a stamper is not suited to fabrication of a stamper having a micrometer scale pattern (more than 1 μm), although it is useful for manufacturing a stamper with a nanoscale pattern (less than 1 μm) primarily because exposure and heat treatment require significantly high precision.

Even when LIGA is used to control a pitch and a height of the pattern, this method has disadvantages such as demand for high processing precision and high processing cost.

Moreover, it is difficult to fabricate a disk type stamper with a large area (such as a diameter of more than 4 inches) by LIGA and, when the area of the stamper is increased, manufacturing costs are dramatically increased.

DISCLOSURE OF INVENTION

Technical Problem

An object of the present invention devised to solve the above problems lies on provision of a method for manufacturing a master mold capable of forming a micropattern over a large area of a film applied to an outer side of a household appliance at a low cost.

Another object of the present invention devised to solve the above problems lies on provision of an apparatus and a method for production of films with different micropatterns regardless of size of area of the film, using the foregoing master mold.

Solution to Problem

The object of the present invention can be achieved by providing a method for manufacturing a master mold capable of forming a micropatterned film wherein the film is applied to an exterior of a household appliance, including: applying photoresist to a surface of a substrate and UV irradiating the same through a patterned mask, in order to transfer the pattern of the mask to the substrate; etching the substrate to which the pattern has been transferred; and removing the photoresist from the etched substrate.

The substrate may comprise a stainless steel material.

The substrate etching process may include wet etching.

The stainless steel substrate may take the form of a roller and the pattern may be formed on a circumference (that is, side surface) of the roller.

The foregoing method may further include replication of the pattern of the above substrate (STS) on a synthetic resin substrate.

The replication process may include, applying UV curable resin to the synthetic resin substrate; pressing the STS substrate against the synthetic resin substrate wherein the STS substrate has the pattern formed thereon and the synthetic resin substrate has UV curable resin applied thereto, and curing the UV curable resin so as to replicate the pattern of the STS substrate on the synthetic resin substrate; and separating the synthetic resin substrate having the pattern replicated thereon from the STS substrate.

After replication, a process of combining both ends of the synthetic resin substrate so as to form a belt may be further included.

The synthetic resin may comprise polyethylene terephthalate.

The UV curable resin may comprise an acrylic UV curable resin.

An apparatus for production of a micropatterned film which is applied to an exterior of a household appliance may include, a resin application device to apply UV curable resin to a synthetic resin film; a patterning device having a micropatterned master mold, which presses the master mold against the UV curable resin of the film in order to form a pattern on the UV curable resin; and a resin curing device which irradiates the patterned UV curable resin of the film with UV light in order to cure the resin.

The patterning device may include, a soft (or flexible) master mold rotating around at least two rollers; two pressure rollers to press the film coated with the UV curable resin and the master mold between the rollers; and a feeding roller to move the patterned film toward the resin curing device after passing the film through the pressure rollers.

The film formation apparatus may further include a winding roller to wind the film over the roller after passing through the resin curing device.

A method for production of a micropatterned film which is applied to an exterior of a household appliance may include, applying UV curable resin to a synthetic resin film; pressing a micropatterned master mold against the UV curable resin of the film and imprinting the micropattern of the master mold on the UV curable resin; UV irradiating the film in order to cure the UV curable resin having the pattern formed thereon; and removing the master mold from the patterned film combined with the cured UV resin.

The master mold may have a micropattern formed on a surface of a synthetic resin substrate made of a soft material. The pattern imprinting process is conducted by winding the soft master mold around the roller and imprinting the micropattern of the master mold on the UV curable resin while rotating the master mold.

The synthetic resin film may comprise PET.

Advantageous Effects of Invention

According to the method for manufacturing a master mold of the present invention, a master mold capable of forming a micropattern over a large area of a film applied to an exterior of a household appliance may be manufactured at a low cost.

According to the film formation apparatus and method of the present invention, mass-production of films having different micropattern designs may be successfully attained regardless of size of area of the film.

BRIEF DESCRIPTION OF DRAWINGS

The accompanying drawings, which are included to provide a further understanding of the invention, illustrate embodiments of the invention and together with the description serve to explain the principle of the invention.

In the drawings.

BEST MODE FOR CARRYING OUT THE INVENTION

Reference will now be made in detail to the preferred embodiments of the present invention, examples of which are illustrated in the accompanying drawings.

Figure 1:
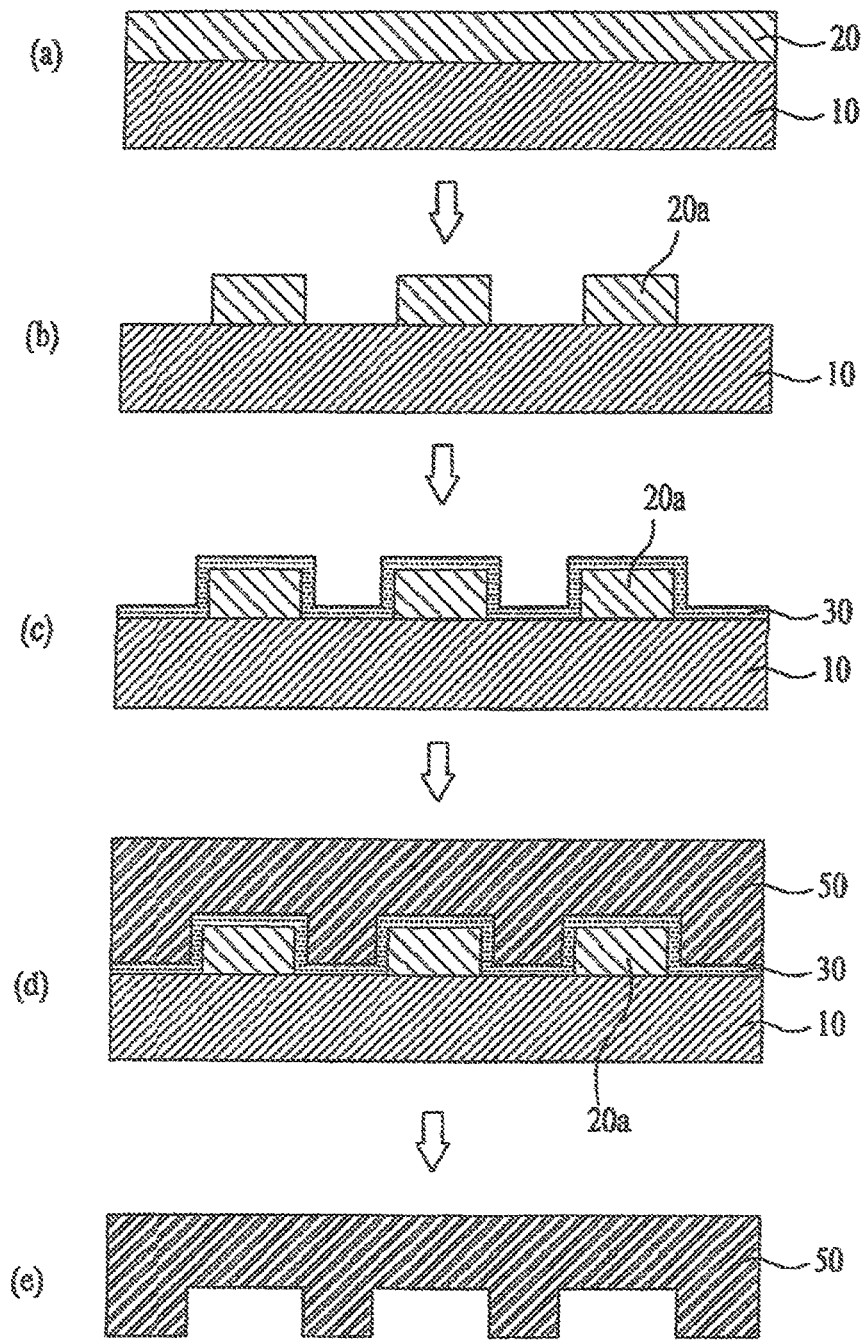
FIG. 1 illustrates a cross-sectional view of a stamper manufacturing process according to a conventional method.
Figure 2:
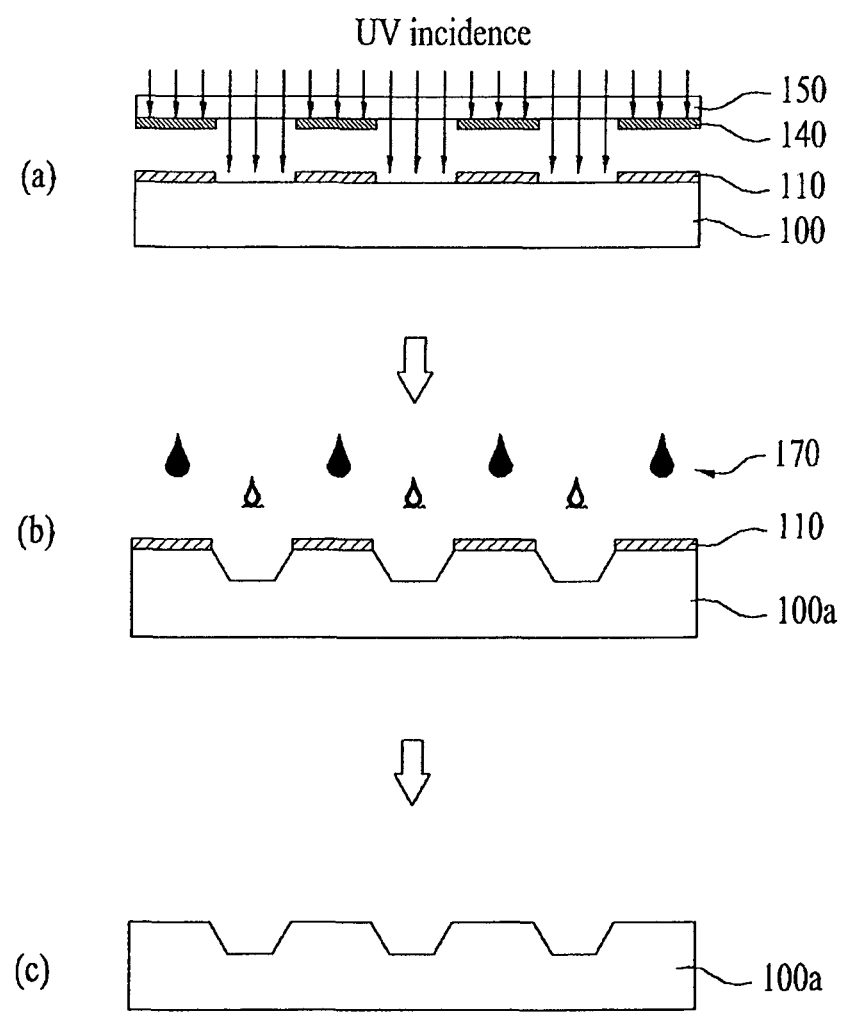
FIG. 2 illustrates a cross-sectional view of a process for manufacturing a master mold according to one embodiment of the present invention.

FIG. 2 is a cross-sectional view illustrating a process for manufacturing a master mold according to one embodiment of the present invention.

A method for manufacturing a master mold capable of forming a micropatterned film for application to an exterior of a household appliance, according to one embodiment of the present invention, comprises: applying photoresist 110 to a surface of a substrate 100 and UV irradiating the same through a mask 140 which has a pattern formed thereon, in order to transfer the pattern to the substrate 100; etching the substrate 100 to which the pattern has been transferred; and removing the photoresist 110 from the etched substrate 100a.

The substrate may be made of stainless steel material.

According to the present invention, the stainless steel substrate may be subjected to lithography and an etching process in order to directly form a pattern thereon.

As shown in FIG. 2(a), after applying the photoresist 110 to the surface of the stainless steel substrate 100, the surface may be subjected to UV irradiation through a glass plate 150 to which the patterned mask 140 is attached in order to expose the surface, followed by development. As a result, the pattern of the mask 140 may be firstly transferred to the photoresist 110 applied to the stainless steel substrate 100.

Then, as shown in FIG. 2(b), adding an etching solution 170 to the treated stainless steel substrate 100 to etch the same produces a desired pattern on a surface of the stainless steel substrate 100. Rather than dry etching based on gas plasma reaction, wet etching using a particular etching solution may have advantages in terms of production cost.

An etching process of stainless steel material generally uses an acid based etching solution. When the exposed surface of the above stainless steel substrate is corroded along the mask pattern in the photoresist using the etching solution, the corroded part forms a recessed pattern on the stainless steel surface.

Finally, as shown in FIG. 2(c), the patterned STS substrate, that is, a master mold 100a may be formed by removing the photoresist 110 remaining on the etched stainless steel substrate 100. The master mold 100a according to the inventive embodiment may be referred to as a hard mold 100a as it consists of stainless steel.

Such a master mold 100a is generally fabricated from a flat stainless steel sheet, thus being a plate type mold. However, if the stainless steel sheet is in a roller form and a pattern is formed on this sheet according to the foregoing processes, a master mold having a micropattern formed along a circumference of the roller may be fabricated. Furthermore, with regard to patterning of a plate type stainless sheet according to the present invention, ends of an elongated sheet may be attached to each other around the circumference of the roller if the sheet is sufficiently thin, in turn fabricating a roller type master mold. The roller continuously rotates the fabricated master mold, on which a pattern has been formed, thereby continuously imprinting the pattern on the film continuously provided in a belt form. Therefore, a film having a replicated micropattern may be efficiently produced.

Figure 3:
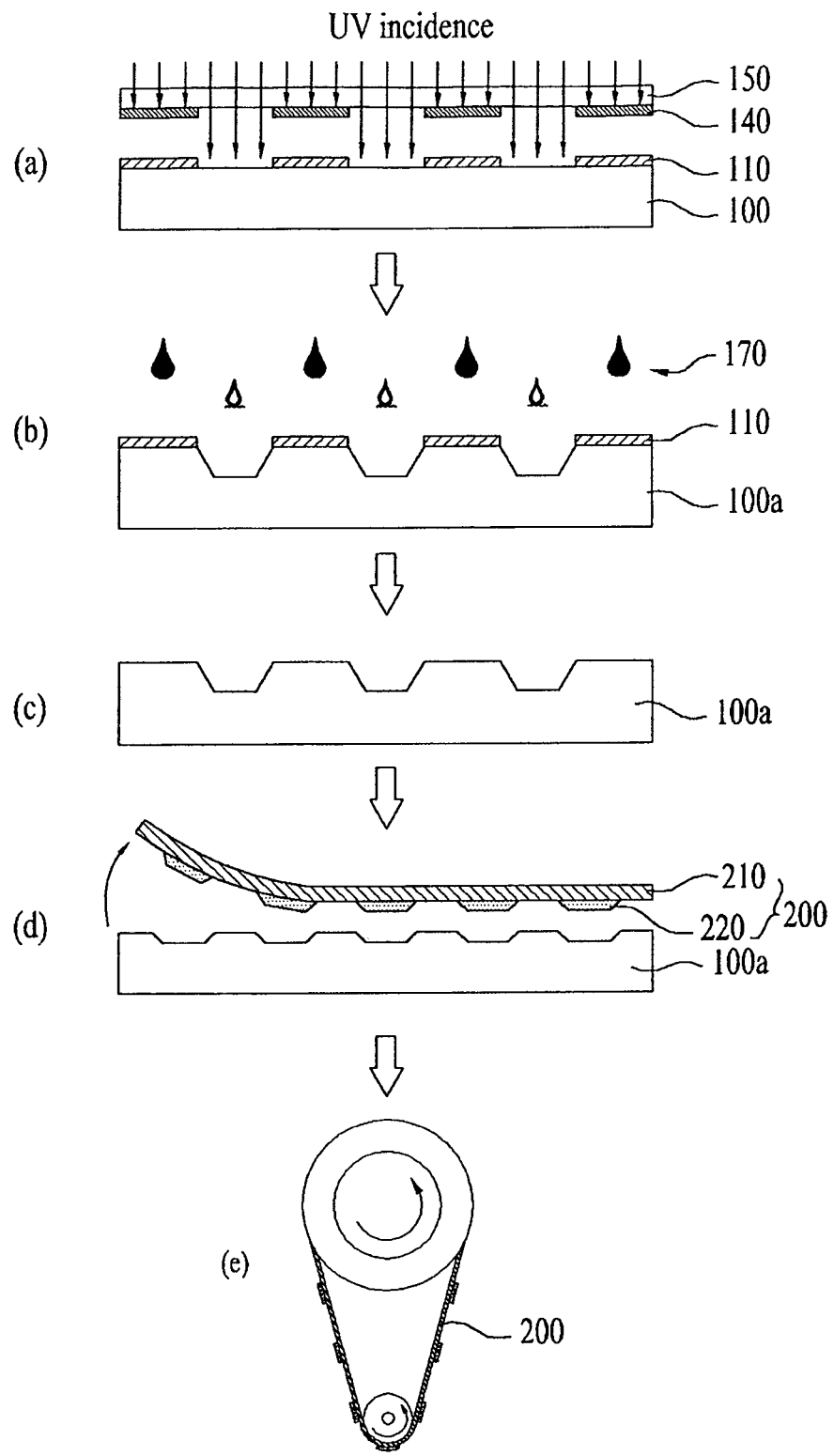
FIG. 3 illustrates a cross-sectional view of a process for manufacturing a master mold according to another embodiment of the present invention.

FIG. 3 is a cross-sectional view illustrating a process of manufacturing a master mold according to another embodiment of the present invention.

A method for manufacturing a master mold capable of forming a micropatterned film for application to an exterior of a household appliance according to another embodiment of the present invention comprises: applying photoresist 110 to a surface of a stainless steel (STS) substrate 100 and UV irradiating the same through a patterned mask 140, in order to transfer the pattern to the substrate 100; etching the STS substrate to which the pattern has been transferred; removing the photoresist 110 from the etched STS substrate 100a; and replicating the pattern of the STS substrate 100a on a synthetic resin substrate 210. That is, the method for manufacturing a master mold according to the foregoing embodiment may further include a process of replicating the pattern of the STS substrate 100a on the synthetic resin substrate 210.

As shown in FIG. 3(a), after applying the photoresist 110 to the surface of the STS substrate 100, the surface may be subjected to UV irradiation through a glass plate 150 to which the patterned mask 140 is attached. As a result, the pattern of the mask 140 may be firstly transferred to the photoresist 110 applied to the STS substrate 100. Then, as shown in FIG. 3(b), adding an etching solution 170 to the treated STS substrate 100 to etch the same may form a desired pattern on a surface of the STS substrate 100. Finally, as shown in FIG. 3(c), a stainless steel substrate having a pattern formed thereon, that is, a hard mold 100a, may be fabricated by removing the photoresist 110 remaining on the etched STS substrate 100.

Figure 4:
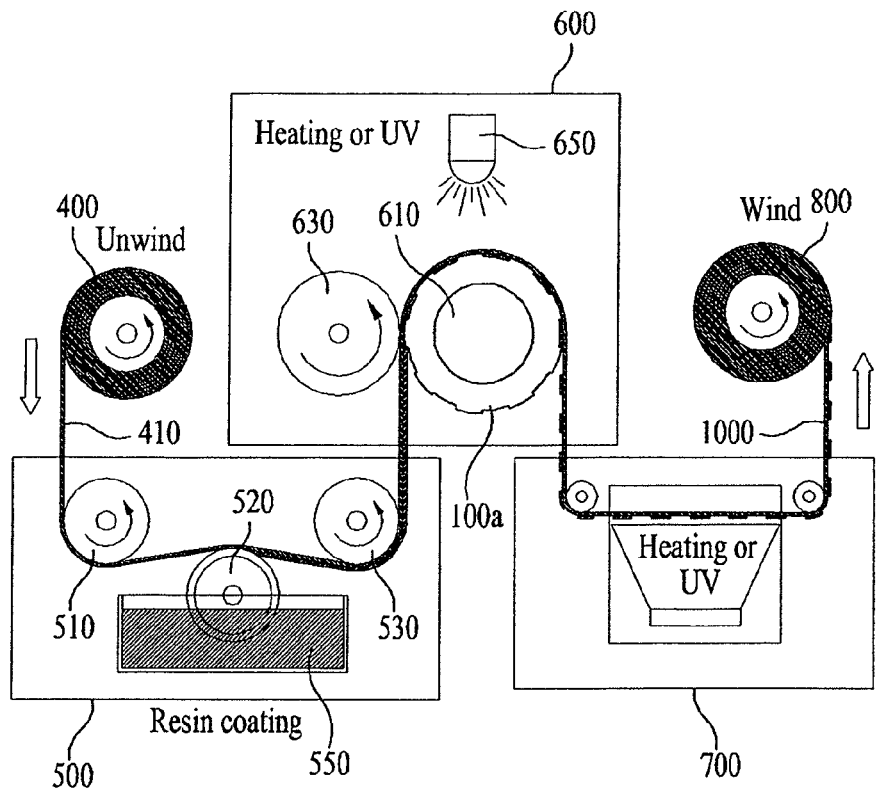
FIG. 4 illustrates an apparatus and a process for production of micropatterned films using a hard mold as one of the master molds manufactured according to the present invention.
Figure 5:
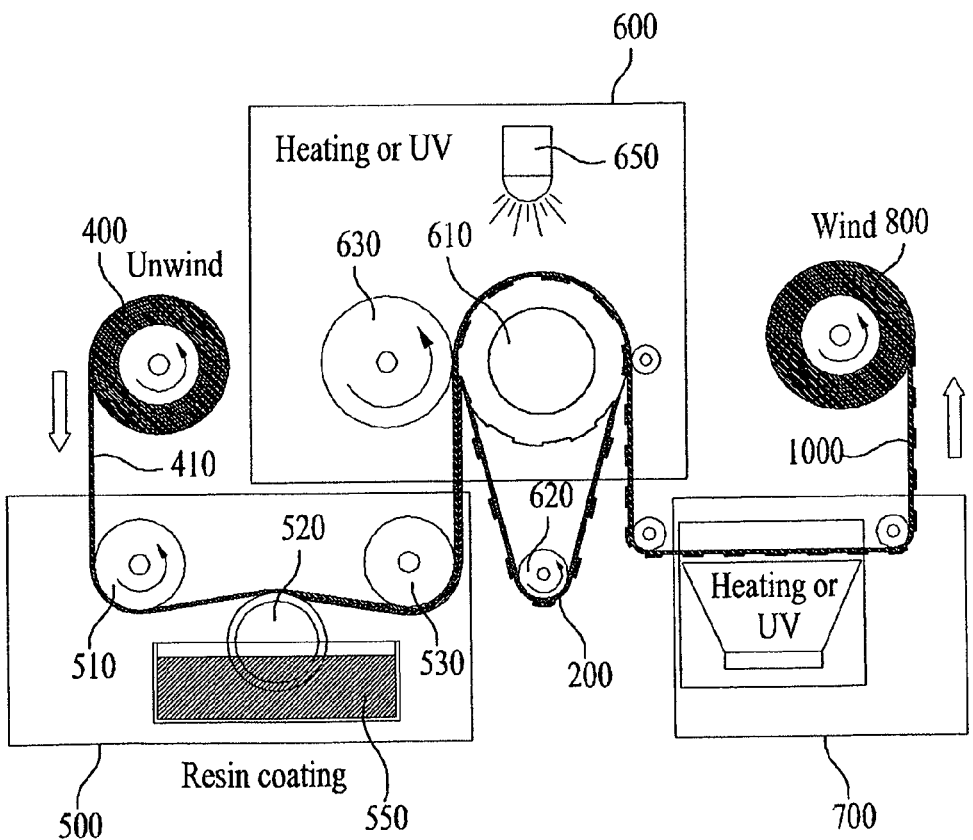
FIG. 5 illustrates an apparatus and a process for production of micropatterned films using a soft mold as one of the master molds manufactured according to the present invention.

FIG. 4 illustrates a process for production of a micropatterned film using the hard mold 100a made of STS material. An apparatus and a method for production of the micropatterned film will be described in further detail. According to the present invention, in order to obtain excellent design freedom, easily increase a size of the film, and prevent influence upon shape and/or size of lines forming the pattern, micropattern imprinting is preferably conducted using a soft mold 200 rather than the hard mold 100a. Therefore, the soft mold 200 made of a synthetic resin may be fabricated by replicating the pattern of the hard mold on the synthetic resin substrate using the hard mold 100a.

As shown in FIG. 3(d), the pattern replication process may comprise: applying UV curable resin 220 to the synthetic resin substrate 210; placing the patterned STS substrate, that is, the hard mold 100a over the synthetic resin substrate 210 wherein the UV curable resin 220 is applied to the substrate 210, pressing the same and curing the UV curable resin 220, in order to replicate the pattern of the STS substrate 100a on the synthetic resin substrate; and separating the patterned synthetic resin substrate 210 from the STS substrate 100a.

The UV curable resin 220 is a synthetic resin curable by UV irradiation. After applying the UV curable resin 220 to the substrate 210, the hard mold 100a is placed and pressed over the applied UV curable resin, in turn transferring the pattern of the hard mold 100a to the UV curable resin 220. Then, the UV curable resin 220 is subjected to UV irradiation to cure the same and the synthetic resin substrate 210 having the pattern formed thereon is separated from the hard mold 100a, in turn providing a complete soft mold 200 made of a soft material.

In addition, as shown in FIG. 3(e), a process of attaching both ends of the soft mold 200 to each other in order to form a belt may be further included after pattern replication. A continuous belt type soft mold 200 may be used to form a pattern by winding a sufficient length of soft mold 200 over at least two rollers, instead of winding the soft mold 200 having a length identical to a circumference of a single roller over the single roller alone. As a result, the micropattern may be continuously and accurately formed on a film, although the film consists of a soft synthetic resin and has the micropattern formed thereon.

The synthetic resin used for a base of the soft mold 200 may comprise PET. PET is a flexible and transparent synthetic resin, which is suitable for fabrication of a soft mold having a micropattern formed thereon. Further, the UV curable resin may be an acrylic UV curable resin. The acrylic UV curable resin is transparent and has good formability and excellent UV curability.

The pattern transferred according to a face coating process is not influenced by shape and/or size of lines, thus usefully replacing most of typical designs for outward appearance. In addition, other advantages such as easy scale-up, no demand of expensive semiconductor equipment resulting in low cost production, etc. may be accomplished.

Meanwhile, an apparatus for production of a micropatterned film applied to an exterior of a household appliance according to the present invention may comprise: a resin application device 500 to apply UV curable resin 550 to a synthetic resin film 410; a patterning device 600 that presses a micropatterned master mold against the UV curable resin 550 of the film 410, so as to form a desired pattern; and a resin curing device 700 for UV irradiating the UV curable resin 550 of the patterned film, so as to cure the same.

FIG. 4 illustrates an apparatus and a process for production of a film using the hard mold 100a as one of the master molds according to the present invention. As described above, the hard mold 100a is fabricated by a face coating process including application of the photoresist 110 to a surface of the STS substrate 100 and UV irradiation thereof in order to form a pattern; and a wet etching process including addition of an etching solution 170 to the STS substrate 100 in order to etch the same and form a desired pattern. Using a diamond bit for mechanical processing, a micropattern may be directly formed on a surface of a mold roller 610.

First, a roller 400, around which a synthetic resin film 410 is wound, is prepared and rotatably mounted near the resin application device 500. A film 410 unwound from the unwinding roller 400 moves on a resin applying roller 520 through a feeding roller 510. A part of the resin application roller 520 rotates while being immersed in a bath containing UV curable resin 550, in turn applying the UV curable resin 550 to a surface of the film 410 with a constant thickness. The film 410 coated with the UV curable resin 550 is transported to a patterning device 600 via another feeding roller 530.

The patterning device 600 may include a master mold 610 having a micropattern formed on a circumference of a roller, and a pressure roller 630 that presses the film 410 coated with the UV curable resin 550 between the master mold 610 and the pressure roller 630. A UV projector 650 for curing the UV curable resin 550, wherein the pattern of the master mold 610 is replicated on the UV curable resin, may be placed above the master mold 610. The UV projector may be replaced by a heater to heat the UV curable resin 550 or the UV projector and the heater may be simultaneously provided.

Following this, the film 410 having a replicated pattern formed by the master mold 610 may pass through a resin curing device 700 having the UV projector, thus completing the curing process. Herein, the heater may be additionally used together with the UV projector, thereby simultaneously or separately performing heating and UV irradiation.

Finally, the inventive film formation apparatus may further include a winding roller 800 around which a film 1000 passing through the resin curing device 700 is wound. The film 1000 having a micropattern formed after completion of curing is duly wound around the winding roller 800. The micropatterned film 1000 may be suitably cut and applied to a desired household appliance on the basis of shape and/or size required for the same.

However, when a hard mold is fabricated by mechanical processing, either horizontal or vertical patterns only are embodied in the master mold and the film having a replicated micropattern formed by the master mold, in turn causing decrease in design freedom. Also, a roll type hard mold needs a large-scale roll in order to increase a size of the film and a design for the film to at least 300 mm, thus increasing production costs. Accordingly, formation of a micropattern using the hard mold 100a made of STS material as the master mold in the present invention is preferably applied to a design having a size of less than 300 mm.

As to formation of a pattern having a size of at least 300 mm on the film, the patterning device may comprise: a master mold 200 made of a soft material which is provided to rotate around at least two rollers; two pressure rollers 610 and 620 that press the UV curable resin coated film 410 and the master mold 200 between the two rollers; and a feeding roller to transport the patterned film 410 toward the resin curing device 700 after passing the film through the pressure rollers 610 and 620.

The master mold 200 according to the foregoing embodiment is a soft mold having the pattern of the hard mold 100 reproduced on the film. Such a soft mold 200 is tightly wound over a first mold roller 610 having a large diameter and a second mold roller 620 having a smaller diameter. Here, when rotating the rollers 610 and 620, the soft mold 200 is rotated and transfers the pattern to the film 410 coated with the UV curable resin 550.

Other technical configurations described in the foregoing embodiment are substantially the same as described in the previous embodiment for the hard mold 100a and, therefore, a detailed description thereof is omitted for clarity.

A method for production of a micropatterned film applied to an exterior of a typical household appliance according to the present invention, may comprise: applying UV curable resin 660 to a synthetic resin film 410; winding a soft master mold 200 having a micropattern formed thereon over a roller and pressing the mold against the film 410 while rotating the master mold, thereby imprinting the pattern of the master mold 200 on the film; UV irradiating the film 410 to cure the patterned UV curable resin 550; and separating the patterned film having the cured resin from the master mold 200.

The film 410 may be a PET film.

Figure 6:
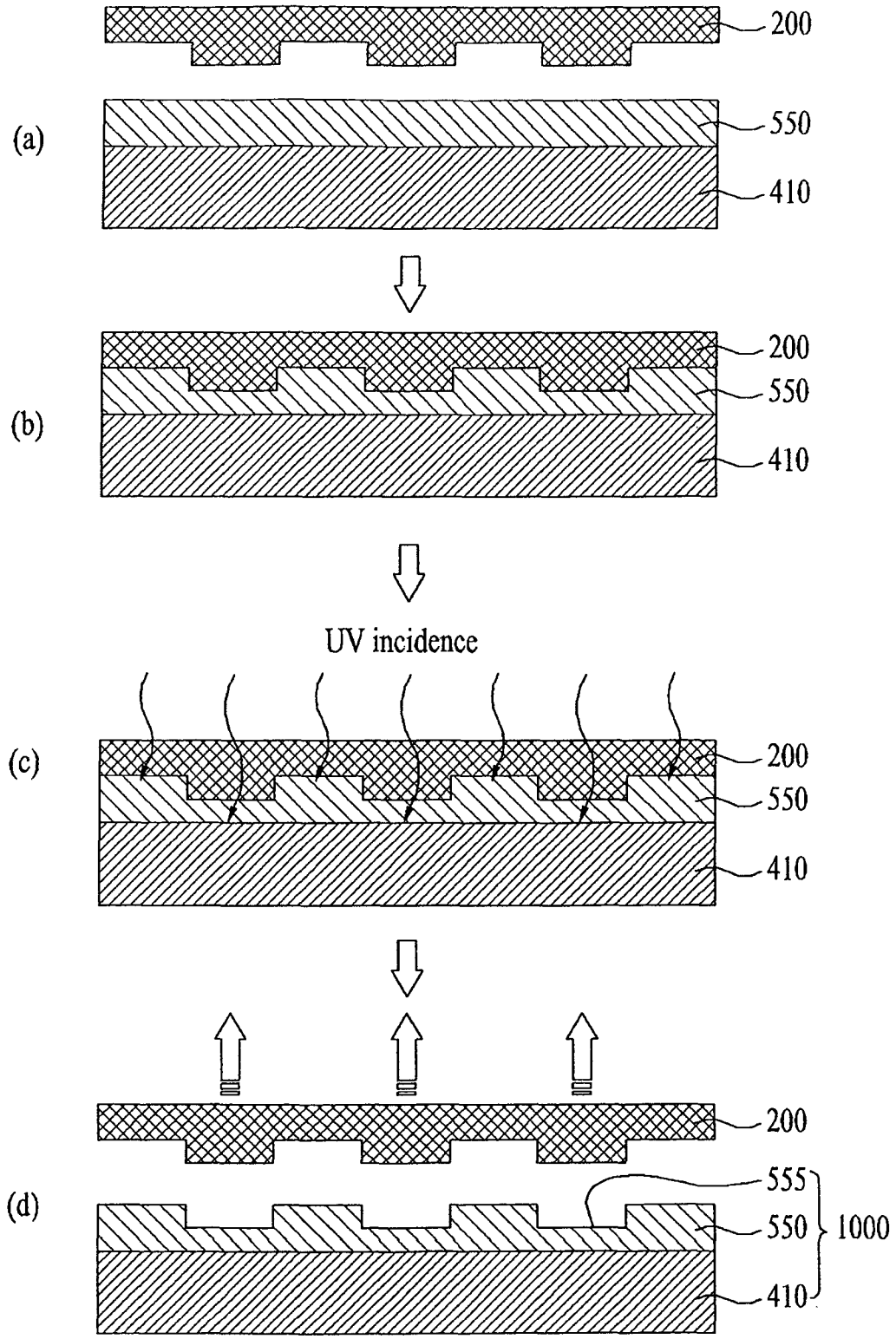
FIG. 6 illustrates a schematic cross-sectional view of a process for formation of a micropattern on a film, using the master mold.

FIG. 6 schematically illustrates a process of forming a micropattern on a film using a master mold. The master mold illustrated in FIG. 6 may be the soft mold 200 described above. Although FIG. 6 relates to the process of producing a film using the soft mold 200, a micropatterned film 1000 may be formed even using a hard mold 100a, according to the same procedures as illustrated in the above figure.

As shown in FIG. 6(a), the UV curable resin 550 is first applied to the film 410 to a desired thickness, followed by placing the master mold 200 on the film 410. Then, as shown in FIG. 6(b), the master mold 200 is pressed against the UV curable resin 550 of the film 410 in order to replicate the micropattern of the master mold 200 on the UV curable resin 550.

Following this, as shown in FIG. 6(c), the UV curable resin 550 of the film 410 may be cured through UV irradiation. With respect to the apparatus for production of the micropatterned film described above, UV irradiation was conducted after removing the master mold 200 from the film. However, as for the foregoing process of forming a micropattern on a film, UV irradiation may also be conducted before separation of the master mold 200 since UV light is capable of penetrating the synthetic resin film 410 so as to reach the UV curable resin 550. Regarding this point, the film 410 may be a transparent PET resin film.

Finally, as shown in FIG. 6(d), when the master mold 200 is separated from the UV curable resin 550 after curing the same, fabrication of the micropatterned film is completed. According to the film production method of the present invention, micropatterned films may be continuously produced using the foregoing film formation apparatus, in turn enabling mass production of the films.

The micropatterned film fabricated according to the present invention may be desirably cut in terms of shape and/or size of the replicated pattern and the film applied to appliances, and attached to various household appliances such as a refrigerator, a washing machine, an air-conditioner, etc.

Figure 7:
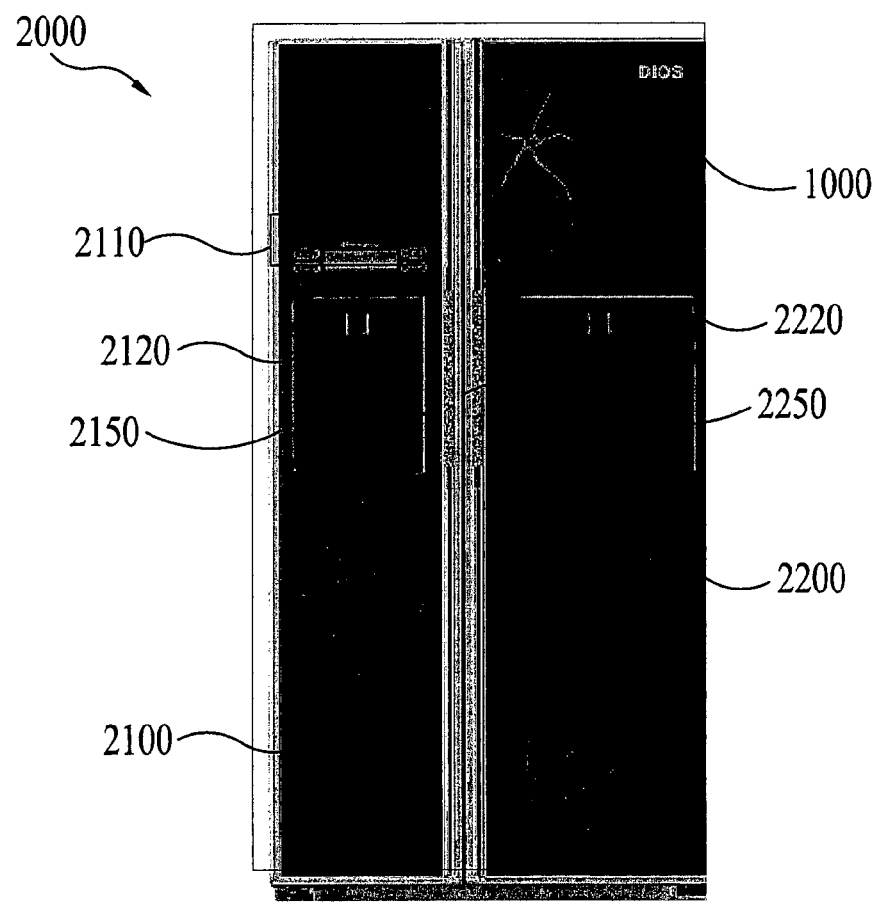
FIG. 7 illustrates a front view of a refrigerator having the micropatterned film produced by the present invention.

FIG. 7 illustrates a front side of a refrigerator having a micropatterned film attached thereto, as a representative household appliance, wherein the micropatterned film is fabricated according to the present invention. The refrigerator 2000 shown in FIG. 7 may be a side-by-side type refrigerator having a freezer compartment door 2100 and a refrigerator compartment door 2200, respectively, which are opened in both opposite directions with reference to a vertical line. The doors 2100 and 2200 have respective handles 2150 or 2250.

An operation part 2110 in which several buttons and a display part are provided to control the refrigerator is placed above the freezer compartment door 2100. A dispenser door 2120 opening or closing a front face of a dispenser, through which water or ice is dispensed, may be provided below the operation part 2100. Moreover, a home bar door 2220 is provided above the refrigerator compartment door 2200 at a right side of the refrigerator. A micropatterned film 1000 having a flower design or an operation part pattern formed thereon is attached to the front face of such doors 2100 and 2200.

Figure 8:
FIG. 8 illustrates a micropatterned film applied to an operation part of a refrigerator wherein the micropatterned film is produced according to the present invention.

The foregoing exemplary embodiments of the present invention illustrated that the micropatterned film 1000 having a flower design is attached to a top portion of the home bar door 2220 on the front face of the refrigerator compartment door 2200. However, such a micropatterned film of the present invention is substantially applied to the entirety of the front face of the refrigerator compartment door 2200. Likewise, the micropatterned film is also attached to the entirety of the front face of the freezer compartment door 2100. Especially, FIG. 8 is an enlarged view illustrating a part of the micropatterned film applied to the operation part 2110 which is placed above the freezer compartment door 2100.

Figure 9:
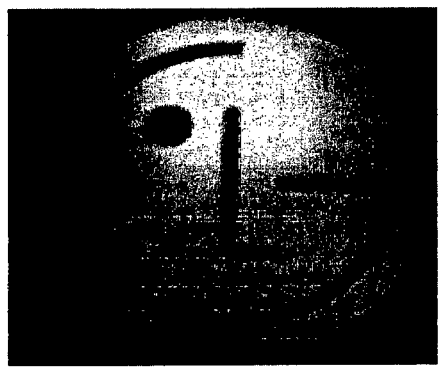
FIG. 9 illustrates examples of the micropatterned film produced according to the present invention.
Figure 9:
Figure 9:
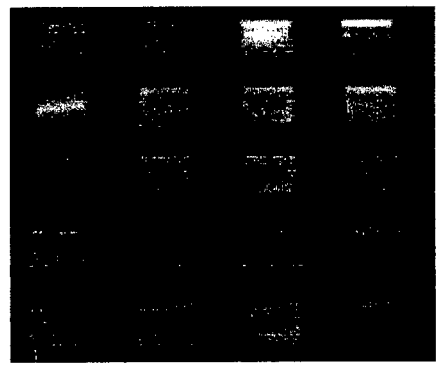
Figure 9:
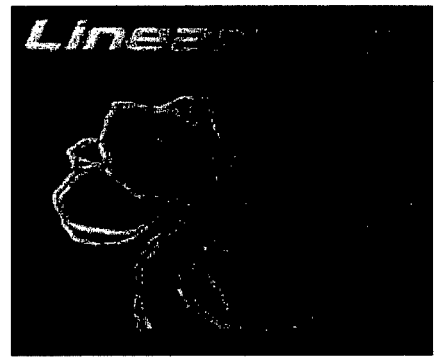

FIG. 9 illustrates some examples of the micropatterned film produced according to the present invention. As shown in FIGS. 9(a) to 9(d), the micropatterned film of the present invention may embody various colors according to a viewing angle owing to light diffraction. In particular, FIG. 9(b) illustrates the micropatterned film having a flower design, which is applied to the refrigerator of FIG. 8. According to the present invention, an alternative printing process using colored inks is not required.

Moreover, other than general household appliances, it will be appreciated that the inventive micropatterned film may be employed to decorate and enhance the appearance of an article by applying the foregoing film to the article.

MODE FOR THE INVENTION

Various embodiments have been described in the best mode for carrying out the invention.

INDUSTRIAL APPLICABILITY

The present invention provides a method for manufacturing a master mold which can form a micropattern over a large area of a film applied to an exterior of an appliance at a low cost.

According to the present invention also provides a film production apparatus and method that enable mass-production of films having different designs of micropatterns regardless of size of area of the film.

Although some exemplary embodiments were described above, the present invention is not duly restricted thereto. It will be apparent to those skilled in the art that the present invention cover modifications and variations, provided they come within the scope of the appended claims and their equivalents.

The invention claimed is:

1. A method for manufacturing a master mold which is used to form a micro-patterned film applied to an exterior of a household appliance, comprising:

applying photoresist to a surface of a metal substrate and UV irradiating the same through a patterned mask to transfer the pattern of the mask to the metal substrate;

etching the metal substrate to which the pattern has been transferred to form a patterned metal substrate;

removing the photoresist from the etched substrate;

applying UV curable resin to a synthetic resin substrate;

pressing the patterned metal substrate against the synthetic resin substrate coated with the UV curable resin and curing the UV curable resin, in order to replicate the pattern of the metal substrate; and separating the patterned synthetic resin substrate from the metal patterned metal substrate, wherein the pattern of the synthetic resin substrate has a pitch and width varying over its location so that the pattern may embody various colors according to a viewing angle owing to constructive and destructive interferences of light.

2. The method according to claim 1, wherein the metal substrate comprises stainless steel.

3. The method according to claim 2, wherein the etching process includes wet etching.

4. The method according to claim 3, wherein the stainless steel substrate is fabricated in a roller shape form and the pattern is formed on a circumference of the roller.

5. The method according to claim 1, wherein the synthetic resin substrate has a large area with a diameter or a length of more than 4 inches.

6. The method according to claim 1, further comprising joining both ends of the patterned synthetic resin substrate to form a belt after the pattern replication.

7. The method according to claim 1, wherein the synthetic resin is polyethylene terephthalate.

8. The method according to claim 1, wherein the UV curable resin is an acrylic UV curable resin.

* * * * *